(12) United States Patent
Hershberg et al.

(10) Patent No.: US 10,574,255 B2
(45) Date of Patent: Feb. 25, 2020

(54) MULTIPLYING DIGITAL-TO-ANALOG CONVERSION CIRCUIT

(71) Applicant: IMEC vzw, Leuven (BE)

(72) Inventors: Benjamin Hershberg, Leuven (BE);
Jan Craninckx, Boutersem (BE);
Ewout Martens, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/181,222

(22) Filed: Nov. 5, 2018

(65) Prior Publication Data

US 2019/0140655 A1    May 9, 2019

(30) Foreign Application Priority Data

Nov. 6, 2017 (EP) .................................... 17200213

(51) Int. Cl.
*H03M 1/66* (2006.01)
*H03M 1/46* (2006.01)
(Continued)

(52) U.S. Cl.
CPC ............ *H03M 1/466* (2013.01); *H03F 3/005* (2013.01); *H03F 3/45475* (2013.01);
(Continued)

(58) Field of Classification Search
CPC ...... H03M 1/466; H03M 1/468; H03M 1/164; H03M 1/1245; H03M 1/442; H03M 1/12;
(Continued)

(56) References Cited

U.S. PATENT DOCUMENTS 7,068,202 B2 * 6/2006 Waltari ............... H03M 1/1245
327/158
7,265,705 B1    9/2007 Lee et al.
(Continued)

OTHER PUBLICATIONS

Ahmed, et al., "A High Bandwidth Power Scalable Sub-Sampling 10-Bit Pipelined ADC With Embedded Sample and Hold", IEE Journal of Solid-State Circuits, IEEE Service Center, Piscataway, NJ, USA, vol. 40, No. 7, Jul. 1, 2008 (Jul. 1, 2008), pp. 1638-1647, XP011229230, ISSN: 0018:9200 *figures 1-7* *p. 1638, left-hand column, line 1—p. 1641, left-hand column, line 20.
(Continued)

*Primary Examiner* — Jean B Jeanglaude
(74) *Attorney, Agent, or Firm* — Knobbe Martens Olson & Bear, LLP (57) ABSTRACT

A multiplying digital-to-analog conversion circuit for use in an analog-to-digital converter is disclosed. In one aspect, the circuit comprises an input block including a capacitor and arranged for switchably connecting a first terminal of the capacitor to an input voltage signal during a first phase and to a fixed reference voltage during a second phase, a sub-analog-to-digital conversion circuit connected to a second terminal of the capacitor and arranged for quantizing a voltage on the capacitor during the second phase, a sub-digital-to-analog conversion circuit that receives the quantized version of the voltage and outputs an analog voltage derived from the quantized version, a feedback block including an amplifier connected to the second terminal of the capacitor and producing, at an amplifier output during a third phase, a residue signal corresponding to a combination of the input voltage signal and the analog voltage, and a feedback circuit.

20 Claims, 4 Drawing Sheets

(51) Int. Cl.
*H03M 1/44* (2006.01)
*H03F 3/00* (2006.01)
*H03M 1/16* (2006.01)
*H03F 3/45* (2006.01)
*H03M 1/12* (2006.01)

(52) U.S. Cl.
CPC ......... *H03M 1/1245* (2013.01); *H03M 1/164* (2013.01); *H03M 1/442* (2013.01); *H03M 1/468* (2013.01); *H03F 2203/45171* (2013.01); *H03F 2203/45396* (2013.01); *H03F 2203/45514* (2013.01); *H03F 2203/45552* (2013.01)

(58) Field of Classification Search
CPC .......... H03M 1/00; H03M 1/66; H03M 1/747; H03F 3/45475; H03F 3/005; H03F 2203/45552; H03F 2203/45514; H03F 2203/45396; H03F 2203/45171
USPC ......................................... 341/150, 155, 144
See application file for complete search history.

(56) References Cited

U.S. PATENT DOCUMENTS

| | | | |
|---|---|---|---|
| 7,965,217 B2 * | 6/2011 | Murden | H03M 1/1215 341/161 |
| 8,120,519 B2 | 2/2012 | Bales | |
| 8,279,102 B2 * | 10/2012 | Lai | H03M 1/1215 341/155 |
| 8,362,939 B2 * | 1/2013 | Buter | H03M 1/0614 324/662 |
| 8,643,527 B2 * | 2/2014 | Kosic | H03M 1/0607 341/144 |
| 8,659,461 B1 | 2/2014 | Zhu et al. | |
| 8,803,721 B1 * | 8/2014 | Boles | H03M 1/164 341/150 |
| 9,019,137 B1 * | 4/2015 | Waltari | H03M 1/1245 341/150 |
| 9,219,492 B1 | 12/2015 | Lok et al. | |
| 9,609,259 B1 * | 3/2017 | Tiew | H04N 5/378 |
| 2011/0221520 A1 * | 9/2011 | Bales | H03F 3/005 330/51 |

OTHER PUBLICATIONS

Lu, "A 1.5 V 10-b 30-MS/s CMOS pipelined analog-to-digital converter", Springer Science + Business Media, LLC 2011, 7 pages.
Wang, et al., "Design of Sample and Hold Merged with 2.5 Bit Multiplying Digital-to-Analog Converter", IEEE, 2012, pp. 1403-1406.
European Search Report for Application No. 17200213.1 dated May 2, 2018 (11 pages).

* cited by examiner

MULTIPLYING DIGITAL-TO-ANALOG CONVERSION CIRCUIT

CROSS-REFERENCE TO RELATED APPLICATIONS

This application claims foreign priority to European Patent Application No. 17200213.1, filed Nov. 6, 2017. The contents of which are incorporated by reference herein in entirety.

BACKGROUND

Field

The disclosed technology is generally related to the field of multiplying digital-to-analog converters as often encountered in switched capacitor analog baseband processing circuits commonly found in applications such as communications, imaging, and analog-to-digital conversion.

Description of the Related Technology

In many applications there is a need for a high-speed, high-resolution analog-to-digital converter (ADC) that can be operated at low supply voltage and with low power consumption. A common implementation of a high-speed, high-resolution ADC is a switched-capacitor pipeline ADC architecture. An illustration of a pipeline A/D converter architecture is found, for example, in the paper "*A 240-Mbps, 1-W CMOS EPRML read-channel LSI chip using an interleaved subranging pipeline A/D converter*" (T. Matsuura et al., IEEE Journal of Solid-State Circuits, vol. 33, no. 11, pp. 1840-1850, November 1998). Each pipeline stage comprises a quantizer (i.e. sub-ADC) and a multiplying digital to analog converter (MDAC) block. In such conventional pipeline ADC the input stage typically is preceded by a sample-and-hold (S/H) circuit to provide the same input to both the quantizer and the MDAC of the first stage.

The sample-and-hold stage at the input of the pipeline consumes significant power, since the noise and linearity requirements of the sample-and-hold amplifier dictate the overall performance of the ADC. The high power consumption arises from the active amplification in the S/H circuit.

In order to reduce the power consumption sample-and-hold (S/H) circuit-less ADC architectures have been proposed in the past. An example is found in "*A 4 GS/s 13b pipelined ADC with capacitor and amplifier sharing in 16 nm CMOS*" (J. Wu, IEEE International Solid-State Circuits Conference (ISSCC), San Francisco, 2016, pp. 466-467). However, the use of two separate sampling paths for the MDAC and sub-ADC at the front of a S/H-less pipelined ADC results in clock skew and bandwidth mismatch effects between the two paths. For high speed inputs these errors can quickly exceed built-in redundancy bounds, leading to hard errors in the ADC output.

Hence, there is a need for a multiplying DAC circuit wherein the abovementioned issues are dealt with without increasing analog power.

SUMMARY OF CERTAIN INVENTIVE ASPECTS

It is an objective of certain embodiments of the disclosed technology to provide for a multiplying DAC circuit The above objective is accomplished by the solution according to the disclosed technology.

In a first aspect, the disclosed technology relates to a multiplying digital-to-analog conversion circuit for use in an analog-to-digital converter, comprising an input block comprising a capacitor and arranged for switchably connecting said capacitor to an input voltage signal at a first terminal of said capacitor during a first phase and to a fixed reference voltage at the first terminal of said capacitor during a second phase, a sub-analog-to-digital conversion circuit connected to a second terminal of said capacitor and arranged for quantizing a voltage on said capacitor during said second phase and arranged to output a quantized version of the voltage on said capacitor, a sub-digital-to-analog conversion circuit arranged to receive the quantized version of the voltage and to output an analog voltage derived from the quantized version, wherein the first terminal of said capacitor is arranged to switchably connect to the analog voltage during a third phase, a feedback block comprising an amplifier arranged to be connected to the second terminal of said capacitor and to produce at an amplifier output during the third phase a residue signal corresponding to a linear combination of the input voltage signal and the analog voltage derived from the quantized version, and a feedback circuit comprising a feedback capacitor arranged to be connected to the input voltage during the first phase, arranged to have at least one terminal floating during the second phase and arranged to connect to the amplifier output during the third phase.

The present solution indeed allows for obtaining a multiplying DAC circuit wherein a passive sample- and hold circuit is integrated. The circuit allows in a first mode, i.e. a sampling mode, to sample the applied input voltage signal during the first phase. The circuit is characterised by its 'hold' mode of operation during a second phase. This hold mode is fully passive and, contrary to prior art solutions, requires no additional amplifier power when an amplifier that can be switched on or off during different phases is used. In this second phase a fixed reference voltage is applied to the first terminal of the capacitor in the input block. The sub-analog-to-digital conversion circuit connected to a second terminal of that capacitor quantizes the voltage on the capacitor and outputs the digitized voltage. During a third phase the circuit is in an 'amplify' mode, a sub-digital-to-analog converter receives this voltage and applies an analog version of it to the capacitor. The amplifier outputs a residue signal corresponding to a linear combination of this analog version of the voltage produced by the sub-DAC and the input voltage signal applied on the capacitor in the sampling phase. The linear linear combination of this analog version of the voltage produced by the sub-DAC and the input voltage signal is, in one embodiment, the difference between these two signals.

In illustrative embodiments, the multiplying digital-to-analog conversion circuit further comprises switching circuitry arranged to have a terminal of said feedback capacitor floating prior to the second phase.

In other illustrative embodiments, the multiplying digital-to-analog conversion circuit further comprises switching circuitry arranged to connect the second terminal of the capacitor to the fixed reference voltage during the first phase and arranged to disconnect from the fixed reference voltage prior to the second phase.

In embodiments the feedback capacitor is arranged to be connected to the fixed reference voltage during the second phase.

In embodiments the multiplying digital-to-analog conversion circuit comprises a plurality of input blocks, whereby the sub-digital-to-analog conversion circuit is arranged to output a set of thermometer coded analog voltages, each being fed to a respective input block. The multiplying digital-to-analog conversion circuit then may comprise a plurality of feedback circuits.

In embodiments of the disclosed technology, the multiplying digital-to-analog conversion circuit is implemented as a differential circuit.

In certain embodiments the amplifier is a ring amplifier.

In one aspect, the disclosed technology also relates to a pipeline analog-to-digital converter circuit comprising a multiplying digital-to-analog conversion circuit as previously described.

In another aspect, the disclosed technology relates to a method for operating a multiplying digital-to-analog conversion circuit as in any of the previous claims. Such method may comprise:

- connecting during a first phase a capacitor comprised in an input block of said multiplying digital-to-analog conversion circuit at a first terminal to an input voltage signal and a feedback capacitor comprised in a feedback circuit to said input voltage,
- connecting during a second phase said capacitor to a fixed reference voltage, and disconnecting at least one terminal of the feedback capacitor during the second phase,
- quantizing a voltage on said capacitor during said second phase and deriving an analog voltage from the quantized voltage,
- connecting during a third phase the first terminal of said capacitor to said analog voltage and the second terminal of said capacitor to an input of an amplifier and connecting the feedback capacitor to an output of the amplifier,
- whereby the amplifier produces a residue signal corresponding to a linear combination of the input voltage signal and the analog voltage.

For purposes of summarizing the disclosed technology and the advantages achieved over the prior art, certain objectives and advantages of the disclosed technology have been described herein above. Of course, it is to be understood that not necessarily all such objectivess or advantages may be achieved in accordance with any particular embodiment of the disclosed technology. Thus, for example, those skilled in the art will recognize that the present innovations may be embodied or carried out in a manner that achieves or optimizes one advantage or group of advantages as taught herein without necessarily achieving other objectives or advantages as may be taught or suggested herein.

The above and other aspects of the disclosed technology will be apparent from and elucidated with reference to the embodiment(s) described hereinafter.

BRIEF DESCRIPTION OF THE DRAWINGS

The disclosed technology will now be described further, by way of example, with reference to the accompanying drawings, wherein like reference numerals refer to like elements in the various figures.

DETAILED DESCRIPTION OF CERTAIN ILLUSTRATIVE EMBODIMENTS

The disclosed technology will be described with respect to particular embodiments and with reference to certain drawings but the innovations herein are not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the disclosed technology requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the recited embodiments can be used in any combination.

It should be noted that the use of particular terminology when describing certain features or aspects of the disclosed technology should not be taken to imply that the terminology is being re-defined herein to be restricted to include any specific characteristics of the features or aspects of the disclosed technology with which that terminology is associated.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

Figure 1:
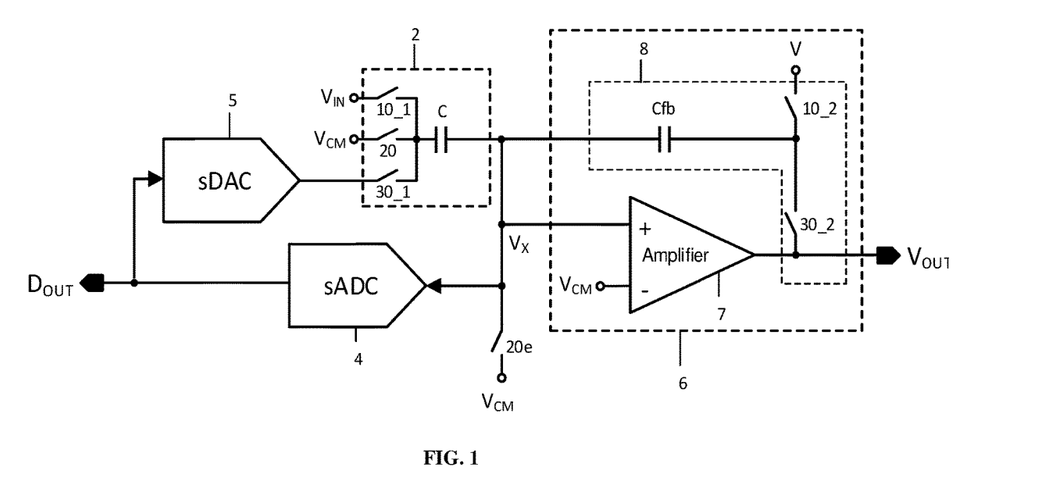
FIG. 1 illustrates an embodiment of a multiplying digital-to-analog conversion (MDAC) circuit according to aspects of the disclosed technology.

A generic scheme of a multiplying digital-to-analog conversion circuit according to an embodiment of the disclosed technology is illustrated in FIG. 1. The input block 2 comprises a switch 10_1 via which an input signal $V_{IN}$ can be fed to a terminal of a capacitor C in the input block of the circuit. Via another switch 20 a fixed reference voltage $V_{CM}$ can be applied. The input block comprises a further switch 30_1 via which an analog voltage coming from a sub-DAC 5 (see below in this description) can be applied to the capacitor C in the input block. The switches 10_1, 20, 30_1 and the signals they let pass, are employed during the various phases of the operation of the circuit.

Figure 2:
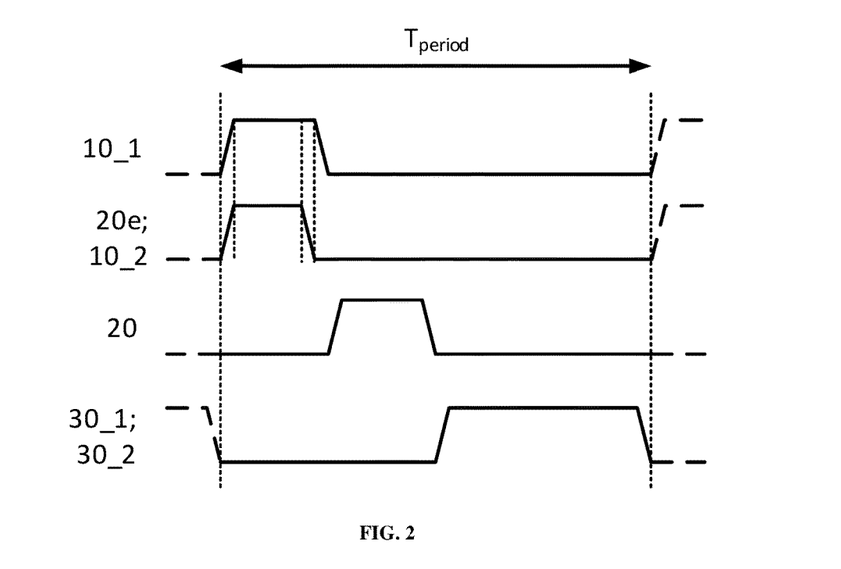
FIG. 2 illustrates a timing diagram illustrating the operation of the MDAC circuit of the disclosed technology.

In a first phase, referred to as the sampling mode, the switch 10_1 is closed, thereby inputting signal $V_{IN}$. The circuit operates in a conventional way, whereby the input voltage signal $V_{IN}$ is applied on a first plate of the capacitor C. The top graph in FIG. 2 illustrates the closing of switch 10 in a time diagram. As illustrated in FIG. 2, at the same moment that switch 10_1 is closed, also switches 20e and 10_2 are closed. As the switch 20e closes, the node between capacitor C and Cfb is thus at the voltage Vx=Vcm, so that Vcm is applied at the second plate of capacitor C. The voltage across capacitor C in this phase is the difference between Vin with respect to Vcm and Vcm, which results in a voltage signal equal to Vin. Also, the second plate of the feedback capacitor Cfb of the feedback circuit 8 comprised in feedback block 6 is now connected to a voltage V via switch 10_2 and the first plate is connected to fixed reference voltage Vcm via switch 20e. The voltage V can be chosen to be equal to Vcm or Vin with respect to Vcm depending on the implementation. For the implementation shown in FIG. 1, the voltage V is equal to Vcm. At the end of the first phase switches 10_1 and 10_2 are opened again. In various embodiments switch 20e is opened a bit earlier than switches 10 to improve sampling linearity, as illustrated in the second line of FIG. 2. Note that in FIG. 2 the notation '10' is used to represent both 10_1 and 10_2.

The second phase, referred to as the hold mode, is the part of the circuit's operation that distinguishes the here described circuit from circuits known in the art. This hold mode is fully passive and requires no additional amplifier power when an amplifier that can be switched on or off during different phases of operation is used. In this second phase the switch 20 is closed (see FIG. 2, third line) so that now a fixed reference voltage $V_{IN}$ is applied to the first plate of capacitor C in the input block. Because the voltage across capacitor C is still Vin, the voltage at node Vx is a negated version of the sampled input voltage with respect to Vcm. The sub-analog-to-digital conversion circuit 4, which is connected to the second plate of that capacitor, quantizes the voltage on the capacitor and outputs the digitized voltage DOUT. This digital signal $D_{OUT}$ is an output signal of the circuit. At least one plate of feedback capacitor Cfb has to be floating in the second phase to ensure that the voltage across the capacitor C enforces the value of Vx to −Vin with respect to Vcm, so that the subADC can quantize the sampled input voltage without the need of amplification. The other plate may be connected to the fixed reference voltage Vcm or also left floating.

The sub-digital-to-analog converter circuit 5 also receives the digital voltage signal DOUT and outputs in a third phase, referred to as the amplify mode, an analog voltage derived from said digital voltage signal. In this third phase the switch 30_1 is closed (see bottom line in FIG. 2), so that the analog voltage produced by the sub-DAC 5 is applied to the capacitor C during the third phase. In this third phase the amplifier 7 comprised in the feedback circuit 6 and connected to the capacitor C, provides at its output a residue signal Vout corresponding to a linear combination (e.g. the subtraction) of the analog voltage produced by the sub-DAC 5 and the input voltage signal Vin that was applied on the capacitor in the sampling phase. In the third phase the feedback circuit 6 is connected to the amplifier output by closing switch 30_2 so that the voltage Vout, which is also output from the circuit, is fed to feedback capacitor Cfb. The switching of 30_2 is performed simultaneously with the switching of 30_1.

As already mentioned, in an embodiment a switch 10_2 is provided to connect the capacitor C to the fixed reference voltage VCM during the sampling phase and to disconnect from the fixed reference voltage when the second (hold) phase begins.

The feedback capacitor Cfb can be connected to the fixed reference voltage Vcm during said second phase through switch 20 and capacitor C.

Figure 3:
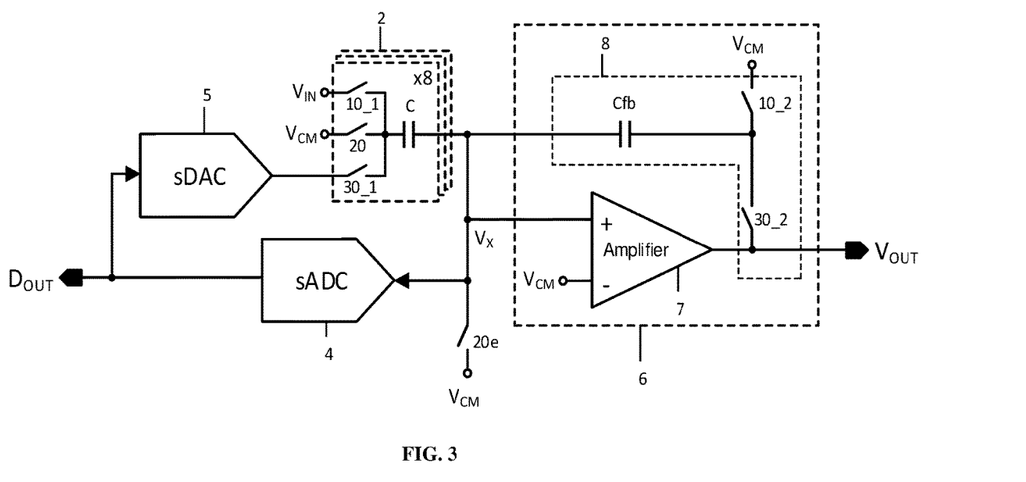
FIG. 3 illustrates an embodiment of an MDAC circuit with multiple input blocks.

FIG. 3 illustrates an embodiment of multi-bit MDAC implementation. In the example shown, an MDAC comprising eight input blocks is given, but a different number is obviously possible. The input voltage is sampled simultaneously on all sampling capacitors C. The operation of the MDAC remains the same as set out before, with the difference that the output of the sub-DAC is a multi-bit output which is fed to the plurality of parallel input blocks.

Figure 4:
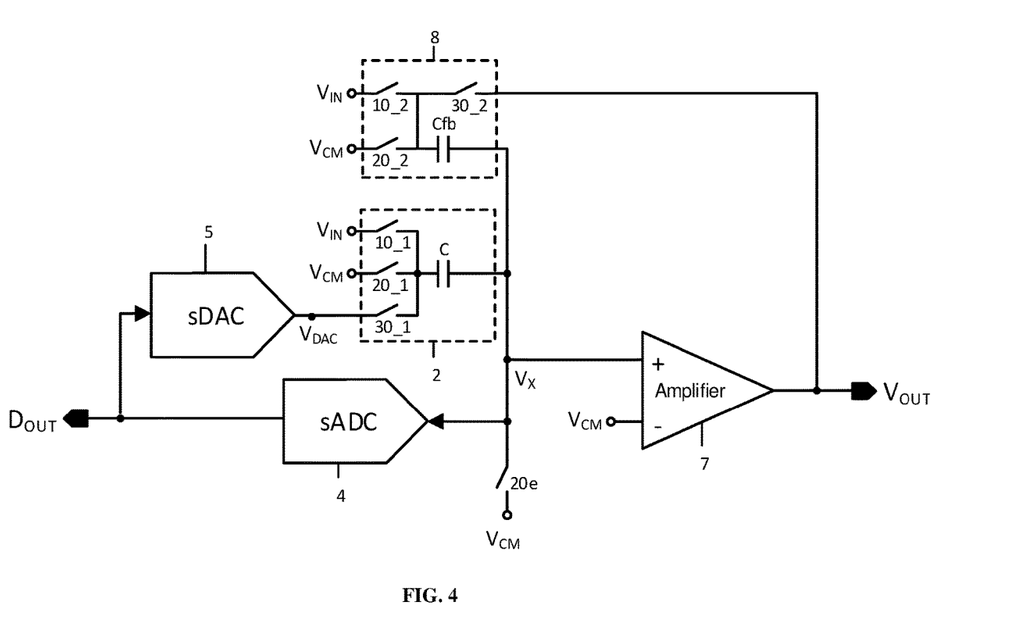
FIG. 4 illustrates another embodiment of an MDAC circuit according to the disclosed technology.

FIG. 4 illustrates one exemplary embodiment of the multiplying DAC circuit of the disclosed technology. The passive sample and hold phase as previously explained is here applied to a 1.5b flip-around MDAC feedback structure. In the sampling phase the circuit operates as in FIG. 1, i.e. the input voltage is sampled across the capacitor network built by capacitors C and Cfb. Switch 20e is opened slightly before the end of the first phase when switches 10_1 and 10_2 are opened. Hence, Vx is floating. In the passive mode (phase 2) the left-side plates of the capacitors C and Cfb are connected to VCM. Because node Vx is floating, this means that the voltage −$V_{IN}$ appears at $V_X$. When accounting for non-ideal parasitics, the actual held voltage appearing at $V_X$ is an attenuated replica of the input: −$V_{IN}$*α, where 0<α<1. Next, in the amplify mode the subDAC applies a voltage proportional to the output of the sADC 4 to a plate of capacitor C via switch 30_1. At the same time, feedback switch 30_2 connects capacitor Cfb to the output of amplifier 7. The resulting feedback loop forces voltages onto certain plates of the input network capacitors and the (assumed ideal) amplifier forces node $V_X=V_{CM}$ due to the feedback loop. This produces a voltage at the stage output $V_{OUT}$ equal to $((Cfb+C)/Cfb)\ V_{IN}-(C/Cfb)\ V_{DAC}$. In the classic 1.5b flip-around MDAC case, C=Cfb, and thus $V_{OUT}=2V_{IN}-V_{DAC}$.

Figure 5:
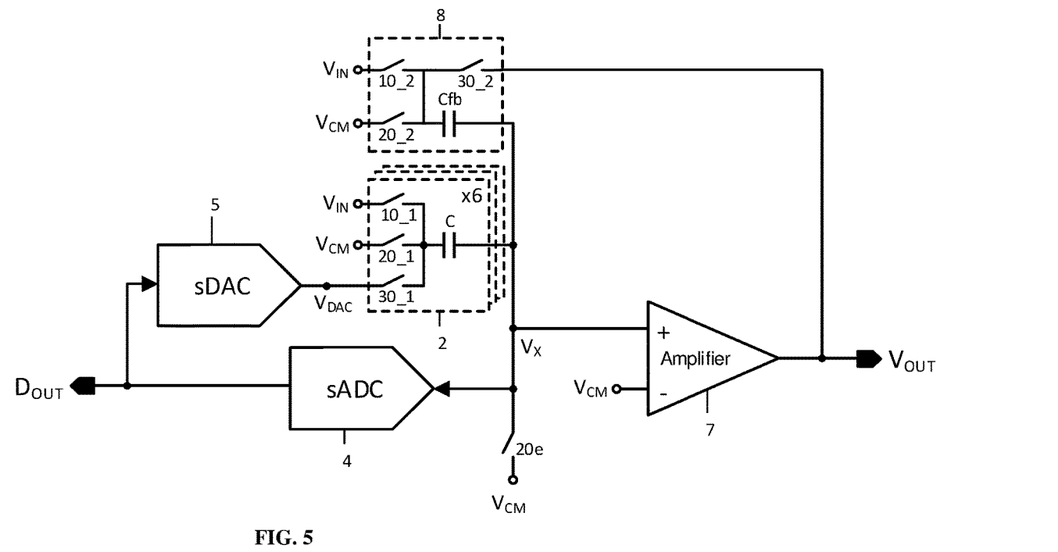
FIG. 5 illustrates the same scheme as in FIG. 4, but with a plurality of input blocks.

FIG. 5 illustrates an embodiment similar to the one of FIG. 4, but now comprising a plurality of input blocks. In this particular example there are six input blocks, but a different number is obviously possible. The operation remains the same as set out before.

Figure 6:
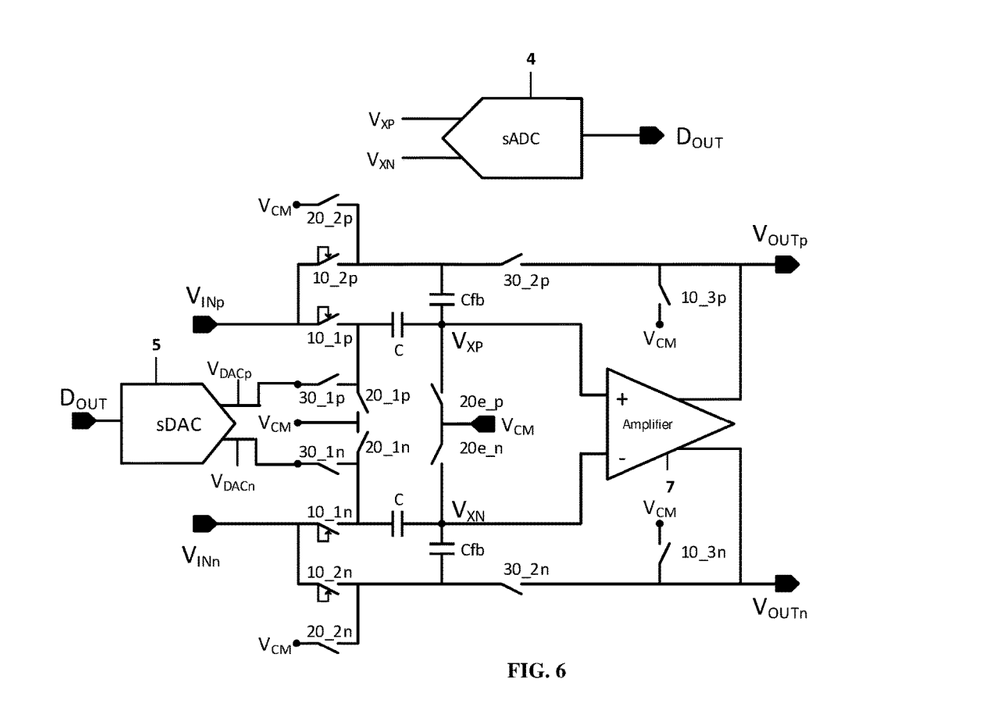
FIG. 6 illustrates the application of an MDAC circuit with passive sample-and-hold part according to the disclosed technology in a 1.5 bit flip-around structure.

FIG. 6 shows a differential implementation of an exemplary MDAC circuit, consistent with aspects of the disclosed technology. The circuit is operated in the same manner as the single-ended implementation of FIG. 4. In the sampling phase, a pair of sampling capacitor C is connected to positive and negative input voltage, Vinp and Vinn via switches 10_1. Also the feedback capacitor Cfb is connected to the input voltage in the first phase. The stored charge relevant to the sampling of the input is contained at Vxp and Vxn at the node between the capacitors C and Cfb. In the hold phase, switches 20_1 are closed so that the fixed reference voltage Vcm is applied to C. Thus, the voltages Vxp and Vxn are the negated versions of the sampled input voltage. The sADC 4 receives at its input the voltages Vxp and Vxn and outputs digitized version Dout of the received voltages which is then converted, in the amplify phase, to analog voltages by sDAC 5. These analog voltages are applied to the capacitors C. The voltages Vxp and Vxn at the input of the amplifier 7 are equal when assuming an ideal amplifier with infinite gain; the exact value of the common voltage at these nodes depends on the common-mode feedback circuit of the amplifier. In this phase, the amplifier is also connected to the feedback network (not indicated in FIG. 6) so that the voltages at the output of the amplifier are amplified residue signals corresponding to a linear combination of the analog voltages produced by the sub-DAC 5 and the respective input voltages Vinp and Vinn. This produces a differential voltage at the stage output $V_{OUTp}-V_{OUTn}$ equal to $((Cfb+C)/Cfb)*(V_{INp}-V_{INn})-(C/Cfb)*(V_{DACp}-V_{DACn})$. In the classic 1.5b flip-around MDAC case, C=Cfb, and thus $V_{OUTp}-V_{OUTn}=2(V_{INp}-V_{INn})-(V_{DACp}-V_{DACn})$.

Figure 7:
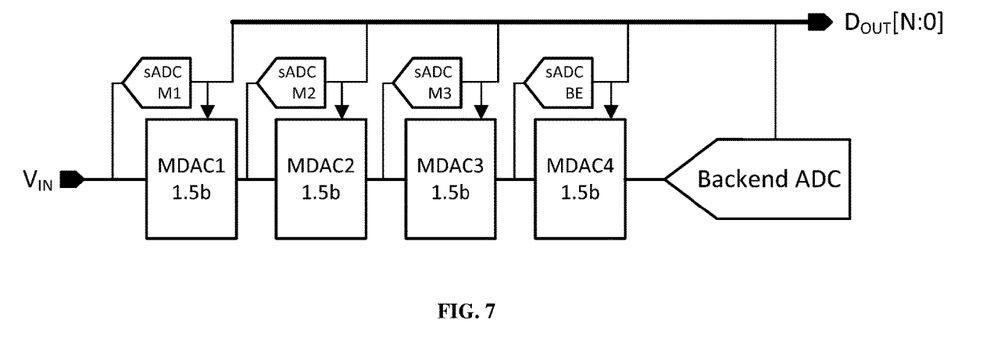
FIG. 7 illustrates a conventional pipeline ADC.

FIG. 7 illustrates a pipeline A/D converter circuit wherein a conventional MDAC circuit is applied. The pipeline structure comprises four 1.5 bit stages in this particular, non-limiting example. In each stage of the pipeline, a subADC performs a coarse quantization of the stage's analog input. This quantization is subtracted from the stage's sampled analog input value and the remaining analog residue is amplified by a fixed gain factor and passed onto the next stage. The backend ADC shown in FIG. 7 can comprise additional pipeline stages, or a different architecture of ADC that uses the residue of the $4^{th}$ stage to perform further quantization, such as a flash or SAR ADC. The sub-ADC sADC M1 in FIG. 7 is connected in the conventional way such that it samples the analog input in parallel with MDAC1. This can result in hard errors in the quantization process due to timing skew and bandwidth mismatch between the two parallel sampling paths.

Figure 8:
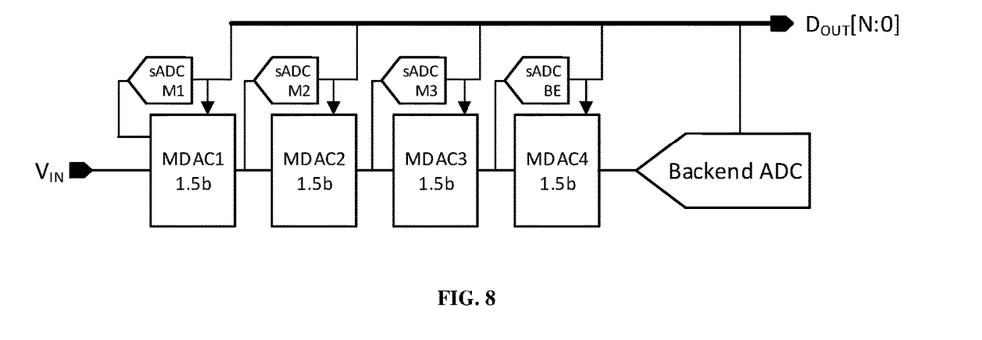
FIG. 8 illustrates a pipeline ADC wherein the MDAC of this disclosed technology is applied to the first pipeline stage.

FIG. 8 illustrates a conventional pipeline A/D converter circuit wherein the MDAC circuit of the disclosed technology is applied to the first pipeline stage. The other pipeline stages can also be implemented using such MDAC circuit(s). Whereas sADC M1 of FIG. 7 samples the input through a parallel path, sADC M1 in FIG. 8 senses the input from the passive sample and hold circuit inside MDAC1. Because MDAC1 and sADC M1 share the same sampled charge information to perform residue amplification and quantization respectively, skew and bandwidth mismatch issues associated with parallel sampling paths are eliminated.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A multiplying digital-to-analog conversion (DAC) circuit for use in an analog-to-digital converter (ADC), comprising
   an input block comprising a capacitor and arranged for switchably connecting the capacitor to an input voltage signal at a first terminal of the capacitor during a first phase and to a single fixed reference voltage at the first terminal of the capacitor during a second phase,
   a sub-analog-to-digital conversion circuit, separate from the input block, connected to a second terminal of the capacitor of the input block and arranged for quantizing a voltage on the capacitor during the second phase and arranged to output a quantized version of the voltage on the capacitor,
   a sub-digital-to-analog conversion circuit arranged to receive the quantized version of the voltage from the sub-analog-to-digital conversion circuit and to output an analog voltage derived from the quantized version to the input block, wherein the first terminal of the capacitor is arranged to switchably connect to the analog voltage during a third phase, and
   a feedback block comprising:
      an amplifier arranged to be connected to the second terminal of the capacitor and to produce at an amplifier output during the third phase a residue signal corresponding to a linear combination of the input voltage signal and the analog voltage derived from the quantized version, and
      a feedback circuit comprising a feedback capacitor arranged to be connected to the input voltage during the first phase, arranged to have at least one terminal floating during the second phase and arranged to connect to the amplifier output during the third phase.

2. A pipeline analog-to-digital converter (ADC) circuit comprising a multiplying digital-to-analog conversion circuit as in claim 1.

3. The multiplying digital-to-analog conversion circuit as in claim 1, further comprising switching circuitry arranged to connect the second terminal of the capacitor to the fixed reference voltage during the first phase and arranged to disconnect from the fixed reference voltage prior to the second phase.

4. The multiplying digital-to-analog conversion circuit as in claim 3, wherein the feedback capacitor is arranged to be connected to the fixed reference voltage during the second phase.

5. The multiplying digital-to-analog conversion circuit as in claim 3, comprising a plurality of input blocks, whereby the sub-digital-to-analog conversion circuit is arranged to output a set of thermometer coded analog voltages, each being fed to a respective input block.

6. The multiplying digital-to-analog conversion circuit as in claim 1, wherein the feedback capacitor is arranged to be connected to the fixed reference voltage during the second phase.

7. The multiplying digital-to-analog conversion circuit as in claim 1, wherein the feedback circuit is arranged to be switchably connected to the input block during the third phase.

8. The multiplying digital-to-analog conversion circuit as in claim 1, implemented as a differential circuit.

9. The multiplying digital-to-analog conversion circuit as in claim 1, wherein the amplifier is a ring amplifier.

10. The multiplying digital-to-analog conversion circuit as in claim 1, further comprising switching circuitry arranged to have a terminal of the feedback capacitor floating in the second phase.

11. The multiplying digital-to-analog conversion circuit as in claim 10, wherein the amplifier is a ring amplifier.

12. The multiplying digital-to-analog conversion circuit as in claim 10, further comprising switching circuitry arranged to connect the second terminal of the capacitor to the fixed reference voltage during the first phase and arranged to disconnect from the fixed reference voltage prior to the second phase.

13. The multiplying digital-to-analog conversion circuit as in claim 10, wherein the feedback capacitor is arranged to be connected to the fixed reference voltage during the second phase.

14. The multiplying digital-to-analog conversion circuit as in claim 10, comprising a plurality of input blocks, whereby the sub-digital-to-analog conversion circuit is arranged to output a set of thermometer coded analog voltages, each being fed to a respective input block.

15. The multiplying digital-to-analog conversion circuit as in claim 14, comprising a plurality of feedback circuits.

16. The multiplying digital-to-analog conversion circuit as in claim 10, wherein the feedback circuit is arranged to be switchably connected to the input block during the third phase.

17. The multiplying digital-to-analog conversion circuit as in claim 10, implemented as a differential circuit.

18. The multiplying digital-to-analog conversion circuit as in claim 1, comprising a plurality of input blocks, whereby the sub-digital-to-analog conversion circuit is arranged to output a set of thermometer coded analog voltages, each being fed to a respective input block.

19. The multiplying digital-to-analog conversion circuit as in claim 18, comprising a plurality of feedback circuits.

20. A method for operating a multiplying digital-to-analog conversion (DAC) circuit including a switchable input block, a sub-analog-to-digital conversion circuit separate from the input block and connected to the input block, a sub-digital-to-analog conversion circuit connected to the sub-analog-to-digital conversion circuit, and a feedback block, the method comprising:

connecting, during a first phase, a capacitor arranged in the switchable input block of the multiplying digital-to-analog conversion circuit at a first terminal to an input voltage signal, and a feedback capacitor arranged in a feedback circuit of the feedback block to the input voltage, connecting during a second phase the capacitor to a single fixed reference voltage and disconnecting at least one terminal of the feedback capacitor during the second phase, quantizing a voltage on the capacitor during the second phase via the sub-analog-to-digital conversion circuit that is separate from the switchable input block and connected to a second terminal of the capacitor of the input block, deriving an analog voltage via the sub-digital-to-analog conversion circuit from the quantized voltage via the sub-digital-to-analog conversion circuit, connecting during a third phase the first terminal of the capacitor to the analog voltage and the second terminal of the capacitor to an input of an amplifier and the feedback capacitor to an output of the amplifier, whereby the amplifier produces a residue signal corresponding to a linear combination of the input voltage signal and the analog voltage.

* * * * *

UNITED STATES PATENT AND TRADEMARK OFFICE
CERTIFICATE OF CORRECTION

PATENT NO. : 10,574,255 B2
APPLICATION NO. : 16/181222
DATED : February 25, 2020
INVENTOR(S) : Benjamin Hershberg It is certified that error appears in the above-identified patent and that said Letters Patent is hereby corrected as shown below:

In Column 1, Line 65, delete "circuit" and insert --circuit.--.

In Column 2, Line 54, delete "Linear Linear" and insert --Linear--.

In Column 3, Line 47, delete "objectivess" and insert --objectives--.

In Column 6, Line 4, delete "$V_{IN}$" and insert --$V_{CM}$--.

In Column 7, Line 45, delete "$V_{DAcp}$" and insert --$V_{DACp}$--.

Signed and Sealed this
First Day of September, 2020

Andrei Iancu
*Director of the United States Patent and Trademark Office*